(12) United States Patent
Chen et al.

(10) Patent No.: US 9,653,549 B2
(45) Date of Patent: May 16, 2017

(54) SEMICONDUCTOR DEVICE FORMED WITH NANOWIRE (71) Applicant: UNITED MICROELECTRONICS CORP., Hsin-Chu (TW)

(72) Inventors: Chun Jen Chen, Tainan (TW); Bin-Siang Tsai, Changhua County (TW); Tsai-Yu Wen, Tainan (TW); Yu Shu Lin, Pingtung County (TW); Chin-Sheng Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/166,271

(22) Filed: May 27, 2016

(65) Prior Publication Data
US 2016/0276434 A1   Sep. 22, 2016

Related U.S. Application Data (62) Division of application No. 14/612,352, filed on Feb. 3, 2015, now Pat. No. 9,379,182.

(51) Int. Cl.
| | | |
|---|---|---|
| *H01L 29/66* | (2006.01) | |
| *H01L 29/06* | (2006.01) | |
| *H01L 21/02* | (2006.01) | |
| *H01L 29/423* | (2006.01) | |
| *H01L 29/78* | (2006.01) | |

(Continued)

(52) U.S. Cl.
CPC ...... *H01L 29/0676* (2013.01); *H01L 21/0243* (2013.01); *H01L 21/0262* (2013.01); *H01L 21/02236* (2013.01); *H01L 21/02255* (2013.01); *H01L 21/02381* (2013.01); *H01L 21/02532* (2013.01); *H01L 21/02535* (2013.01); *H01L 21/02587* (2013.01); *H01L 21/02603* (2013.01); *H01L 21/02639* (2013.01); *H01L 21/02664* (2013.01); *H01L 29/068* (2013.01); *H01L 29/0673* (2013.01); *H01L 29/165* (2013.01); *H01L 29/413* (2013.01); *H01L 29/42392* (2013.01); *H01L 29/66795* (2013.01); *H01L 29/775* (2013.01); *H01L 29/785* (2013.01); *H01L 2029/7858* (2013.01)

(58) Field of Classification Search
CPC ............. H01L 29/0673; H01L 29/0676; H01L 29/0649; H01L 29/161; H01L 29/165; H01L 29/42392; H01L 29/66795; H01L 29/785; H01L 21/02236; H01L 21/02255; H01L 21/02532; H01L 21/02603
USPC ........................................................ 257/192
See application file for complete search history.

(56) References Cited

U.S. PATENT DOCUMENTS

| | | | |
|---|---|---|---|
| 9,006,842 B2 | 4/2015 | Colinge | |
| 2008/0210987 A1* | 9/2008 | Bondavalli | ........ G01N 27/4146 257/253 |

(Continued)

*Primary Examiner* — Tu-Tu Ho
(74) *Attorney, Agent, or Firm* — Winston Hsu; Scott Margo (57) ABSTRACT

A semiconductor device is provided. The semiconductor device includes a substrate; a first nanowire disposed over the substrate; a second nanowire disposed over the substrate; a first pad formed at first ends of the first and second nanowires, a second pad formed at second ends of the first and second nanowires, wherein the pads comprise different materials than the nanowires; and a gate surrounding at least a portion of each of the first and second nanowires.

8 Claims, 7 Drawing Sheets

(51) Int. Cl.
*H01L 29/165* (2006.01)
*H01L 29/775* (2006.01)
*H01L 29/41* (2006.01)

(56) References Cited

U.S. PATENT DOCUMENTS

| | | | | |
|---|---|---|---|---|
| 2009/0081854 A1* | 3/2009 | Kim | .................. | B82Y 10/00 438/478 |
| 2014/0353574 A1* | 12/2014 | Li | .................. | H01L 29/0673 257/9 |
| 2015/0243733 A1* | 8/2015 | Yang | ................ | H01L 29/0673 257/401 |

* cited by examiner

SEMICONDUCTOR DEVICE FORMED WITH NANOWIRE

CROSS REFERENCE TO RELATED APPLICATIONS

This application is a Divisional of application Ser. No. 14/612,352 filed Feb. 3, 2015, and included herein by reference.

BACKGROUND OF THE INVENTION

1. Field of the Invention

The present invention relates to a method of forming nanowires over a semiconductor fin structure in an integrated circuit.

2. Description of the Prior Art

The present invention relates to a method of forming nanowires over a semiconductor fin structure in an integrated circuit. As the integrated circuit industry continues the trend towards higher levels of integration, three-dimensional fin structures have been used to increase integration over circuit densities achievable using planar MOS structures. In addition, germanium nanowires have been used in favor of silicon due to higher carrier mobility.

A fin structure with germanium nanowires is known. However, the dimensions of the formed germanium structure must be controlled by strictly controlling the epitaxial growth, which may pose difficulties in reliably forming wires of a desired dimension.

SUMMARY OF THE INVENTION

The present invention provides a novel method of forming germanium-based nanowires over a fin-based semiconductor structure. An exemplary embodiment of the present invention includes a method for forming nanowires having different diameters on a semiconductor substrate. An exemplary embodiment of the invention is a method for forming nanowires over a semiconductor substrate comprising: forming a semiconductor fin structure, said fin structure including a semiconductor material formed with a plurality of fins and a shallow trench isolation formed between adjacent fins; forming a plurality of fin recesses by removing a top portion from each of the plurality of fins so that a top surface of each of the plurality of fins lies below a top surface of the shallow trench isolation formed between adjacent fins; forming a germanium-based semiconductor in the plurality of fin recesses as a germanium-based plug; after forming the germanium-based semiconductor in the fin recesses, removing a top portion of the shallow trench isolation to an extent which exposes side faces of the formed germanium-based plug; annealing the germanium-based plug and the shallow trench isolation to form an insulator around the germanium-based plug as an insulated nanowire, and forming an insulator from at least a portion of the shallow trench isolation as an insulator layer.

An exemplary embodiment of the invention is a semiconductor device comprising: a substrate; a first nanowire disposed over the substrate; a second nanowire disposed over the substrate; a first pad formed at first ends of the first and second nanowires, a second pad formed at second ends of the first and second nanowires, wherein the pads comprise different materials than the nanowires; and a gate surrounding at least a portion of each of the first and second nanowires.

Modifications of the exemplary embodiment would be apparent to one skilled in the art, and such modifications would still fall within the scope of the claims.

These and other objectives of the present invention will no doubt become obvious to those of ordinary skill in the art after reading the following detailed description of the preferred embodiment that is illustrated in the various figures and drawings.

DETAILED DESCRIPTION

Exemplary embodiments of the invention are described below, referencing specific processes, materials and dimensions. However, one skilled in the art would understand that modifications of the details are possible which would still fall within the scope of the appended claims.

Figure 1A:
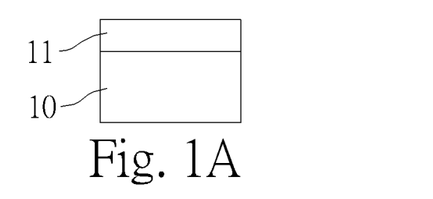
FIGS. 1A-1J show elevational views for forming a germanium nanowire according to a first embodiment of the invention.
Figure 1B:
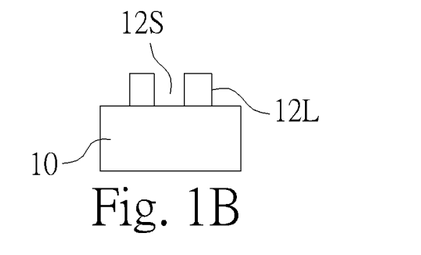
Figure 1C:
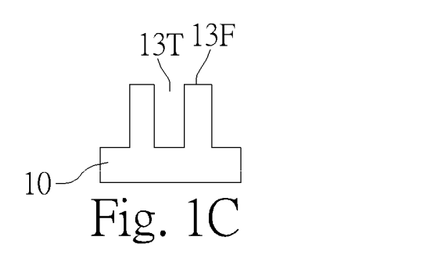
Figure 1D:
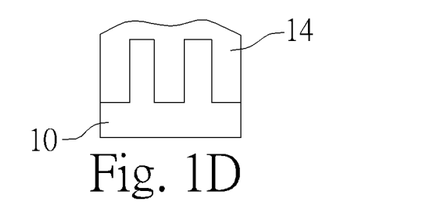
Figure 1E:
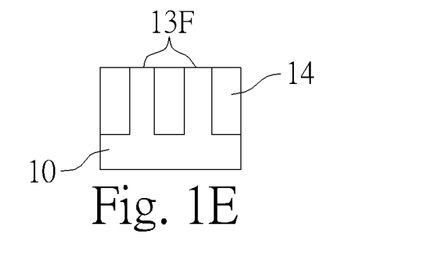

Referring to FIGS. 1A and 1B, a layer of photoresist 11 is coated or applied on a surface of the substrate 10. The substrate 10 can comprise elemental silicon or germanium, SiGe or a III-V compound material such as GaAs, silicon on insulator (SOI) or buried oxide semiconductor (BOX). An array of parallel lines 12L and empty portions 12S is patterned in the photoresist using photolithography. In FIG. 1C, a dry etch is used to etch the substrate 10 exposed by the photoresist 11 to form the trenches 13T. Sulfur hexafluoride ($SF_6$) can be used to etch the substrate 10 to form the trenches, which are separated by the fins 13F. Referring to FIG. 1D, shallow trench isolation 14 is formed over the substrate 10 until the trenches 13T are filled. The shallow trench isolation 14 is typically a dielectric material, such as silicon oxide. In FIG. 1E, planarization is performed to provide a semiconductor fin structure including plural fins 13F and intervening shallow trench 13T filled with shallow trench isolation 14. The planarization can be achieved by chemical mechanical planarization or/and etching back the silicon oxide. While only two fins 13F are shown, many more fins and intervening trenches may make up the semiconductor fin structure.

The general formation of the fin structures are known, and many improvements and refinements are possible.

After the semiconductor fin structure is formed, a top portion of the semiconductor is removed to form fin recesses 13R. The fin portion may be removed by patterning and etching processes for the semiconductor material. As one example, a patterning of photoresist is formed to allow etching of the fin portion (not shown). Then, dry etch is performed to provide the fin recesses 13R shown in FIG. 1F.

Figure 1F:
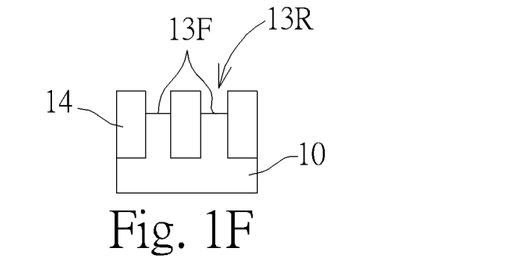

Aside from the SF$_6$ described previously, the dry etching process may utilize a combination of HBr/Cl$_2$/O$_2$/He. The dry etching removes portions of the silicon substrate 10 that are unprotected or exposed. Other gases used in the dry etch may include fluorocarbon, boron, trichloride and other known etchant gases.

Figure 1G:
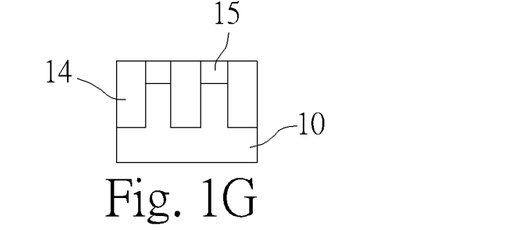

After formation of the fin recesses 13R, a germanium-based semiconductor is formed in the recess portion to form a germanium-based plug 15 in the recessed portion as shown in FIG. 1G. The germanium-based semiconductor may comprise Ge, SiGe or GeSn, for example. The germanium-based material is formed by known methods, such as epitaxial growth. For example, SiGe (Si$_{1-x}$Ge$_x$) is epitaxially grown, where (0.05<x<0.15), or (0.15<x<0.25), or (0.25<x<0.35) in exemplary embodiments. The epitaxial growth occurs along certain axes which depend on the surface orientation of the crystal lattice of the exposed fin. This, in turn, can be adjusted based on an orientation of the semiconductor lattice when cutting the substrate. Because the recessed fin area defines the dimensions of the germanium-based plug, the effects of the silicon substrate crystalline orientation can be set freely in the present method. In an exemplary embodiment, the dimensions of the germanium-based plug 15 may be easily controlled by photolithography, which is generally more controllable than conditions of epitaxial growth.

The germanium-based plug 15 will undergo oxidation-annealing at a later stage to form the nanowires with a high carrier mobility. The annealing may alter the dimensions of the germanium-based plug. As a result, the material being used to form the nanowire should be taken into consideration in forming the fin width and the depth of the fin recess 13R.

For example, if Ge is deposited, the final volume of the Ge will not be changed too much after the annealing. If the nanowire to be formed is 10 nm in diameter, by design, the recess depth (or width) will be close to or slightly larger than 10 nm. On the other hand, if SiGe is deposited as the germanium-based plug, the size of the resulting nanowire after annealing depends on the concentration of Ge in the SiGe. For example, in the case of 50% Ge content, if the nanowire to be formed is 10 nm in diameter, the recess depth (or width) should be closer to or slightly larger than 20 nm.

When the width to depth ratio of the formed recess is about 1:1, the nanowire formed will be close to a perfect circular cross-section after annealing the germanium-based plug. If the width to depth ratio deviates substantially from 1:1, the resulting nanowire will have an elliptical cross-section. In one embodiment, the germanium-based plug includes Ge, and when forming the recess 13R, width to depth ratio of the formed recess 13R is about 1:1. In another embodiment, the germanium-based plug includes GeSn, and when forming the recess 13R, the width to depth ratio of the formed recess 13R is about 1:2.

Figure 1H:
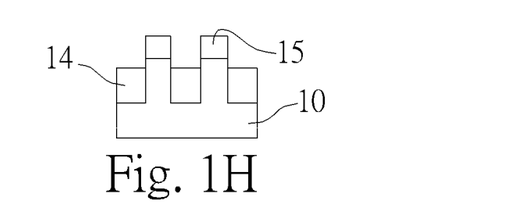

After epitaxial growth of the germanium plug 15, the shallow trench isolation that covers the side faces of the plug is removed to expose the side faces of the germanium plug 15, as shown in FIG. 1H. The etch back of the shallow trench isolation may comprise either wet etching or dry etching. In an exemplary embodiment, the etching may etch the shallow trench isolation 14 until a predetermined depth is reached to expose the plug. The process gas used may include H atoms, for example, hydrofluoric (HF) and ammonia (NH$_3$) based process gases. A selective material removing technology (SiCoNi™) from Applied Materials may also be used to remove the shallow trench isolation 14 and control the height of remaining material.

Figure 1I:
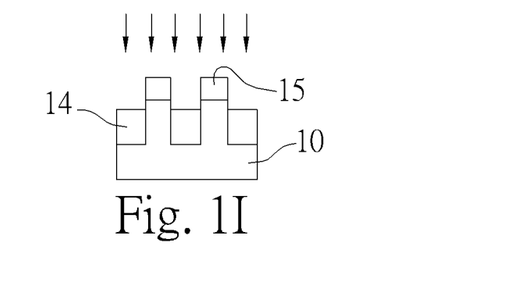

FIG. 1I shows a step of oxidation-annealing of the exposed germanium-based plugs and shallow trench isolation. The oxidation and annealing may occur simultaneously or may occur with oxidation followed by annealing. The oxidation may occur in cycles of oxidation followed by annealing, at appropriate temperatures to reach a certain germanium content when using an SiGe plug. The oxidation-anneal is performed at a temperature below the melting point of the germanium-based plug. In an exemplary embodiment of an SiGe plug, the annealing occurs at a temperature at which viscous flow of silicon oxide will occur (about 950° C.).

In an exemplary embodiment, the oxidation is performed in dry oxygen mixed with a diluent gas or carrier gas. In an embodiment, the diluent gas or carrier gas is a non-oxidizing gas such as nitrogen (N$_2$) or forming gas (H$_2$/N$_2$). In an embodiment, the diluent gas or carrier gas is an inert gas such as argon or helium. In an exemplary embodiment, the anneal is performed in sub-atmosphere or partial vacuum, in diluent or carrier gas as described for the oxidation.

Figure 1J:
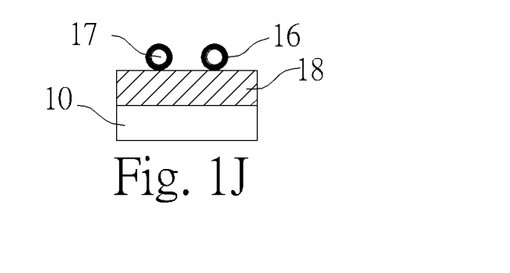

In the case of an SiGe plug, the interactions of the Si and Ge during the oxidation and annealing are understood. In particular, the silicon is thermally oxidized in a preferential manner over germanium at a thermal oxidation interface whenever sufficient quantities of Si and Ge are available. Consequently, heating SiGe 15 on the silicon fin 13F results in diffusion of silicon towards the oxidation interface (outwards), with a silicon oxide outer shell 16 and piling of germanium away from the interface (inwards) as a germanium nanowire channel. In general, the rate of Si redistribution increases with temperature and decreases with an increase in pressure. The result of annealing results in the Ge nanowire channels 17 shown in FIG. 1J As a result of the oxidation and annealing, much of the fin structure also become oxidized to form an insulator layer 18 over the substrate.

With further etching and recessing of the oxide material according to known techniques, the nanowire channels can be reshaped into nanowires suspended away from the substrate. As an alternate to the steps illustrated by FIGS. 1H-1J, the amount of removal of the shallow trench isolation 14 can be varied to form a free-standing nanowire. For example, in FIGS. 2A-2G, the steps are the same to that of FIGS. 1A-1G and are not repeated here. The alternate steps are shown in FIGS. 2H-2L where the process is similar in the prior described exemplary embodiment, but more of the shallow trench isolation 14 is etched away. FIG. 2I includes an oxidation step for oxidizing the additional exposed fin under the germanium plug. FIG. 2J includes removal of the oxide to form suspended semiconductor plugs 15. FIG. 2L shows the result of annealing as suspended nanowires 16. Though FIG. 2L shows a remaining fin portion 13F''', the fin portion can be completely removed if the shallow trench isolation 14 is completely removed at FIG. 2H to expose the entire fin.

Figure 2A:
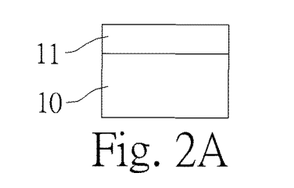
FIGS. 2A-2L show elevational views of alternate steps for forming a nanowire modified from the first embodiment.
Figure 2B:
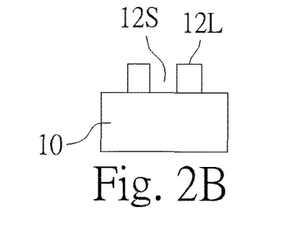
Figure 2C:
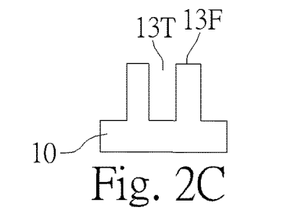
Figure 2D:
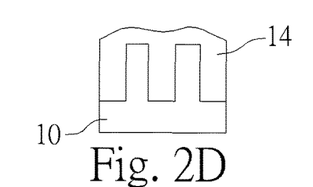
Figure 2E:
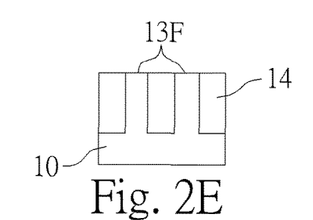
Figure 2F:
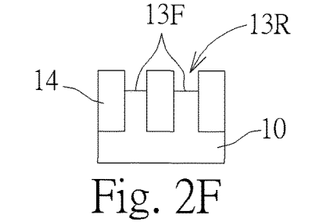
Figure 3A:
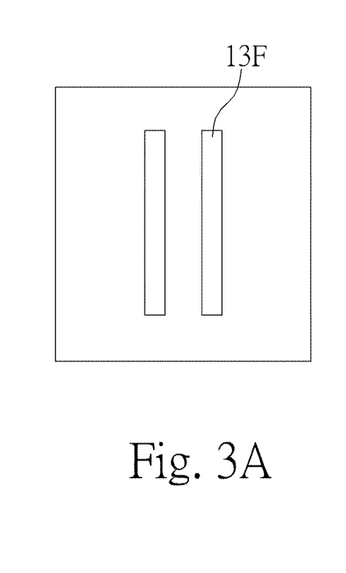
FIGS. 3A-3D show top and side views corresponding to elevational views of the modified first embodiment.

In addition, the degree of exposure along a length of the nanowire line is also controlled by amount of etching of the fin recess step shown in FIG. 2F, above. For example, FIGS. 3A and 4A show a top view of the fins 13F corresponding to end of the process shown in FIG. 2E. One embodiment of masking to perform the fin recess of FIG. 2F is to expose an entire length of the fin, as shown in the top view FIG. 3B. An alternate embodiment to perform fin recess of FIG. 2F is to expose a partial length of the fin as shown in top view FIG. 4B.

Figure 2G:
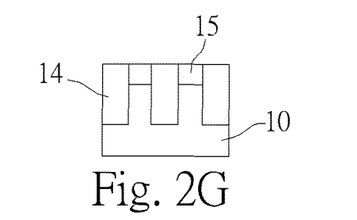
Figure 2H:
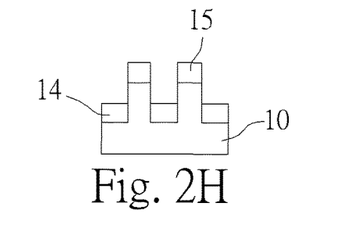
Figure 2I:
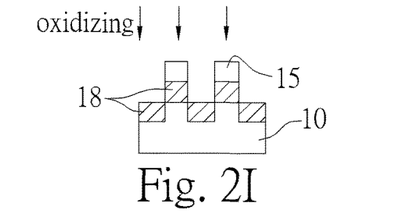
Figure 2J:
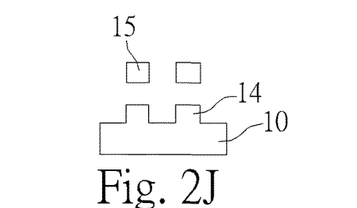
Figure 2K:
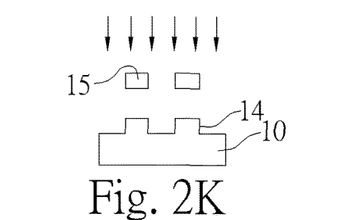
Figure 2L:
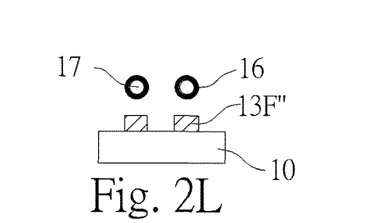
Figure 3B:
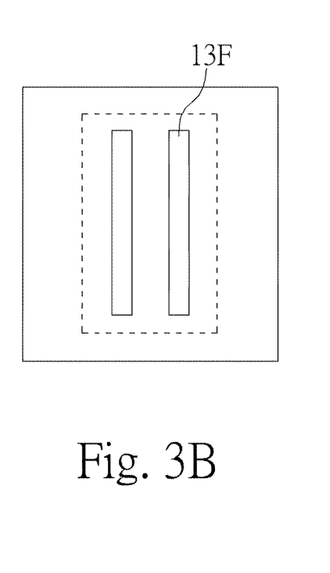
Figure 3C:
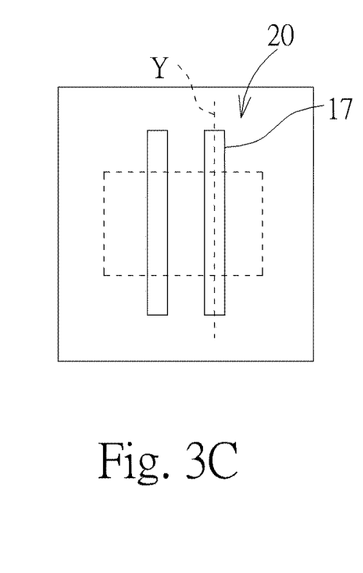
Figure 3D:
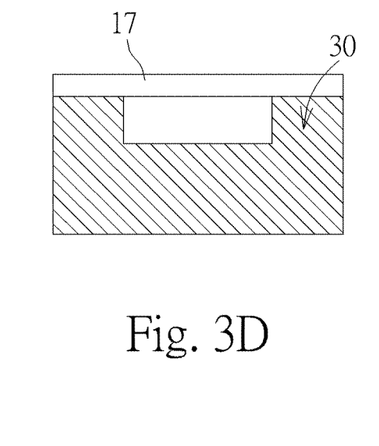
Figure 4A:
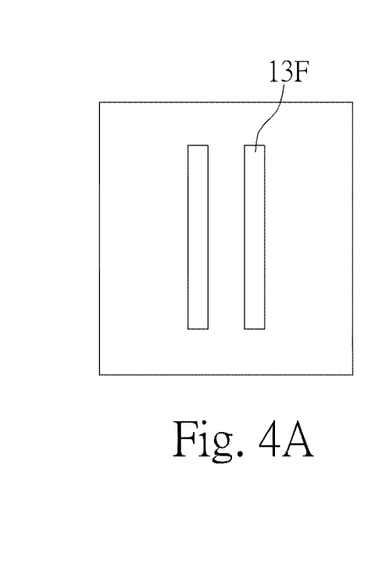
FIGS. 4A-4D show alternate top and side views corresponding to elevational views of the modified first embodiment.
Figure 4B:
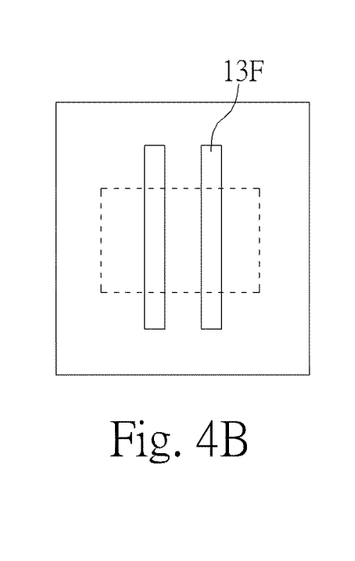
Figure 4C:
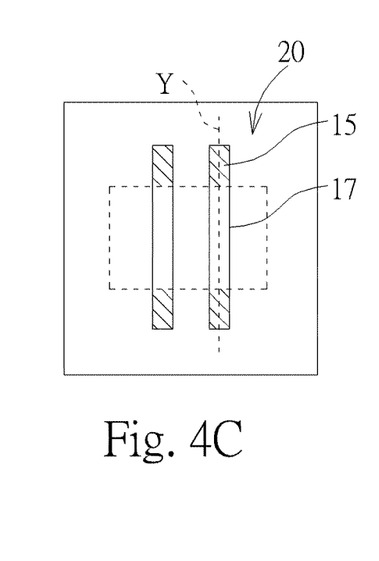
Figure 4D:
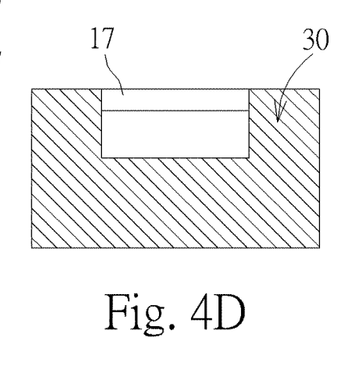

After the structures shown in FIGS. 3B and 4B are formed (recessed fins), the germanium plug formation step is performed (FIG. 2G). In the case of suspended nanowires, a cap oxide step is performed after the germanium plug is formed to open the center portion outlined with the dotted lines in top views FIGS. 3C and 4C. The central opening is formed by photolithography and etching. When the center is opened, removal of silicon fins underlying the germanium plug 15 is performed via steps 2I-2J, followed by annealing to create the suspended nanowire (Step 2K), and removal of the cap oxide 20. FIGS. 3C and 4C correspond respectively to a step after germanium plug 15 is subject to oxidation and annealing to form nanowires 17. Side views taken along the vertically drawn dotted lines Y of FIGS. 3C and 4C are shown respectively in FIGS. 3D and 4D. FIG. 3D shows the side view where an entire length of nanowire is exposed, and FIG. 4D shows the side view where a partial length of nanowire is exposed. In FIG. 3D, the germanium nanowire is connected to an underlying silicon pad. For ease of illustration, the nanowire 17, without an outer shell 16 is shown. In FIG. 4D, the germanium nanowires terminate at their endpoints into silicon pads 30.

Figure 5A:
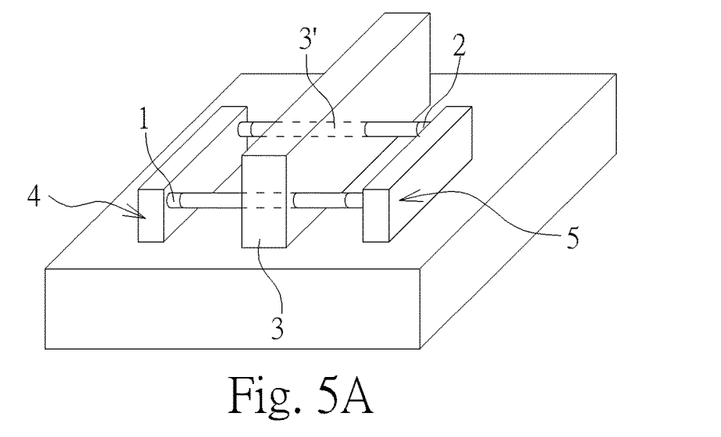
FIGS. 5A-5C show views of a semiconductor device formed according to an exemplary embodiment.
Figure 5B:
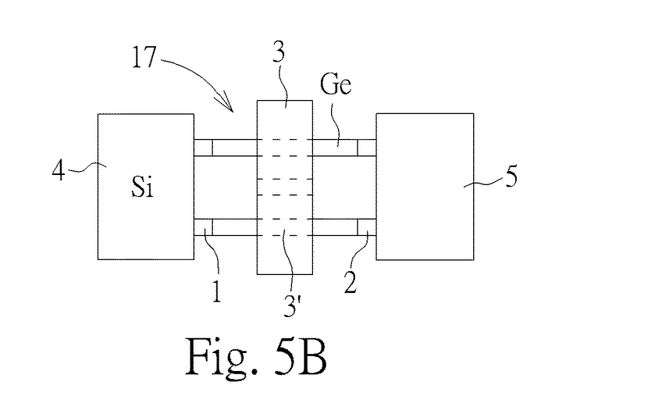
Figure 5C:
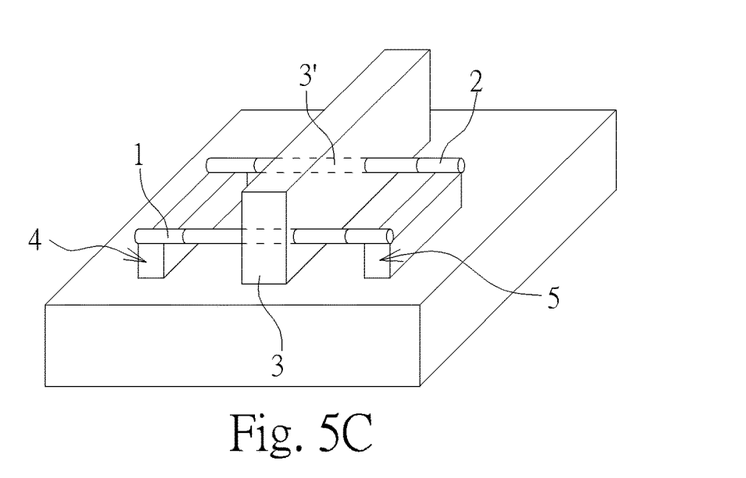

The Ge-based nanowire structure formed according to the exemplary embodiments can serve as channel 3' of the gate structure 3 in between a drain 1 and source as 2 shown in the FET structure FIGS. 5A and 5B. FIG. 5A shows a perspective view, and FIG. 5B shows the top view of the semiconductor arrangement. In FIG. 5B, the common source pad 4 and common drain pad 5 comprise a different material than the nanowire. In an exemplary embodiment, the nanowire may comprise a drain region 1 and source region 2 made of silicon, and a channel region 3' made of germanium. The semiconductor characteristics of respective drain and source regions may either be the same or different from each other depending on the design. While FIG. 5A shows the nanowire structures terminating into pad structures at respective ends, FIG. 5C shows the nanowires disposed on top of underlying pad structures.

The above method describes a process whereby the nanowires formed are substantially the same diameter. However, nanowire FET devices will need to account for devices of different drive current strength and different threshold voltages. Semiconductor devices with nanowires of all the same diameter will rely upon modulation of device threshold voltages by modulation of the gate work function. As such, the devices have relatively difficult and costly process integration.

Additional exemplary embodiments of the invention provide several nanowires with different diameters from each other. The nanowires of different diameters can be used to connect source and drain regions of FET devices having different semiconductor characteristics or similar semiconductor characteristics.

Figure 6A:
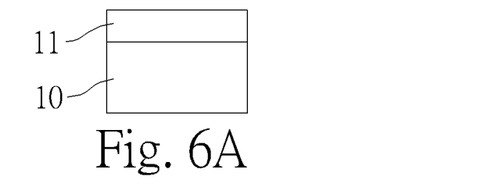
FIGS. 6A-6J show elevational views for forming germanium nanowires with different diameters.
Figure 6B:
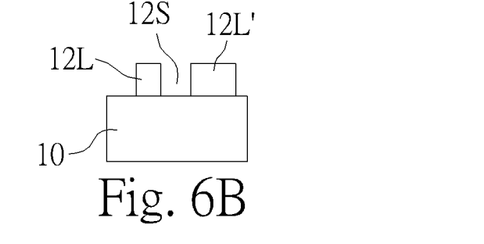
Figure 6C:
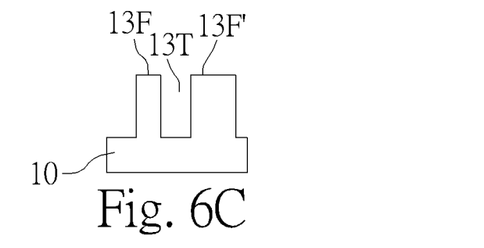
Figure 6D:
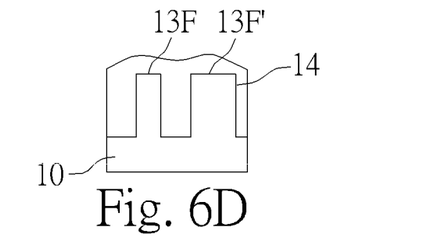
Figure 6E:
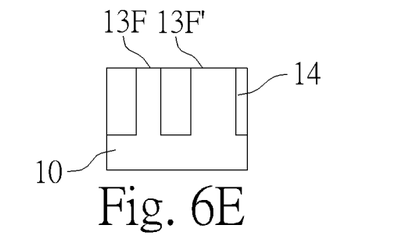
Figure 6F:
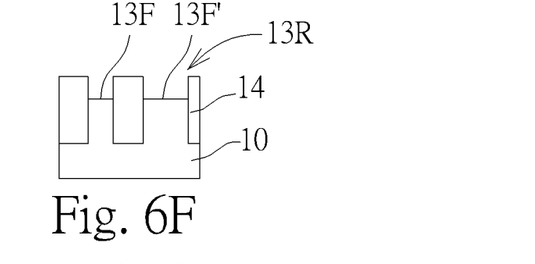
Figure 6G:
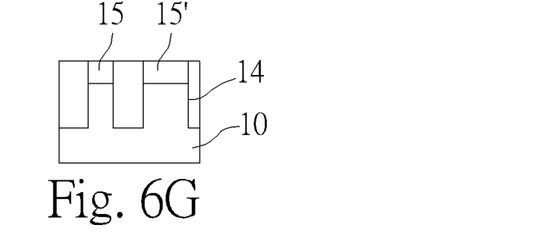
Figure 6H:
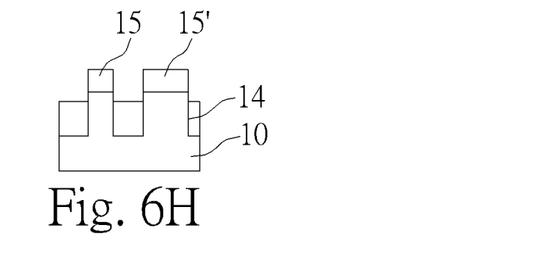
Figure 6I:
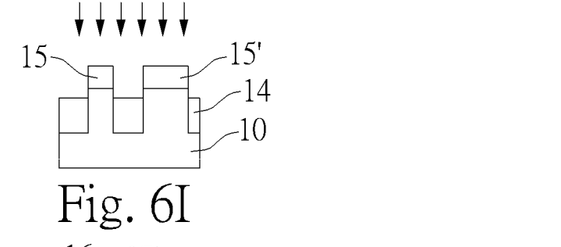
Figure 6J:
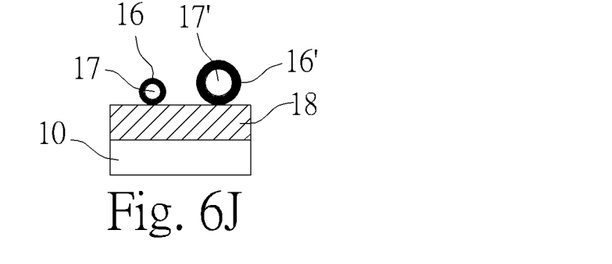

Referring to FIGS. 6A-6J, the steps for forming a nanowire having different diameters from each other are explained. The majority of the process steps are similar to those set forth above for the embodiment of FIGS. 1A-1J. Those portions which are similar are not repeated here. Significantly, in this embodiment, the fins 13F and 13F' have different widths. This is achieved by an appropriate photolithography pattern in the resist 11. For example, in FIG. 6B, the parallel lines 12L and 12L' have different widths. By setting the photolithography pattern, the relative widths of the fin structure can be controlled. Further, since the depth of the fin recess can also be effectively controlled, target dimensions of the resulting annealed nanowire can also be controlled, according to a desired design for the different nanowire dimensions. The relative dimensions of different nanowires can be set to a desired ratio, depending on design requirements. FIG. 6J shows nanowires 17 and 17' having different dimensions based on the difference in size of the formed Ge-based plugs 15 and 15', respectively. That is, the nanowire 17 is formed to a first dimensional cross-section and the nanowire 17' is formed to a second dimensional cross-section different from the nanowire 17, and wherein a ratio of the first dimensional cross-section to the second dimension is controlled to be substantially equal to a predetermined ratio. In one embodiment, the predetermined ratio is substantially equal to an integer.

The differences in fin widths of 13F and 13F' will require a modification in the oxidation and annealing process as follows. Generally, the oxidation and annealing process is controlled by time and concentration. If the width of 13F': width of 13F has a ratio of 2:1, assuming the same ambience and concentration, the time required to fully anneal 13F' and 13F will be proportional to their width, and will be close to 2:1. An exemplary embodiment of the present invention can control the annealing time to control the degree of annealing of each wire. In a preferred embodiment, the annealing time can be controlled to fully anneal 13F' (the widest nanowire), so that all the wires are fully annealed. Thus, the dimensions of the germanium-based plug are determined by the recessed fin area, rather than the process variation of annealing.

Figure 7A:
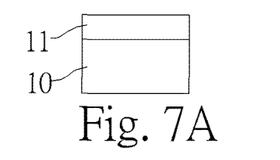
FIGS. 7A-7M shows elevational views for forming germanium nanowires with different diameters according to a further embodiment.
Figure 7B:
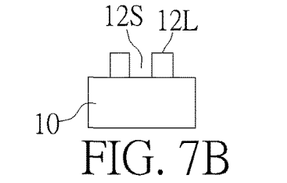
Figure 7C:
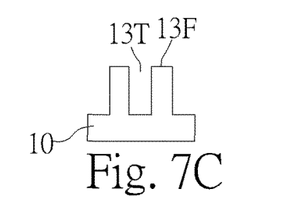
Figure 7D:
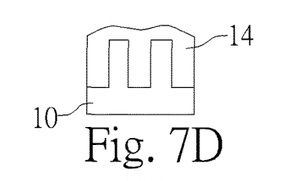
Figure 7E:
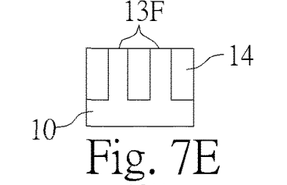
Figure 7F:
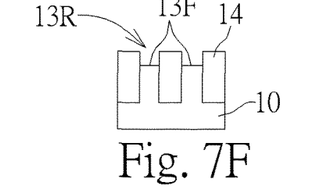
Figure 7G:
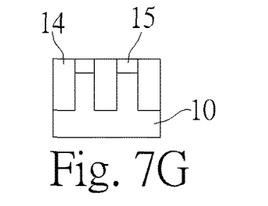
Figure 7H:
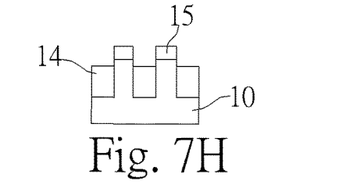
Figure 7I:
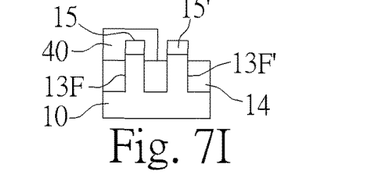
Figure 7J:
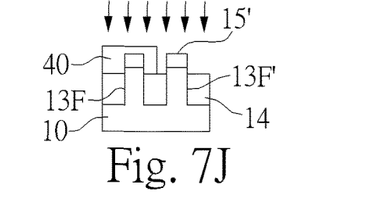
Figure 7K:
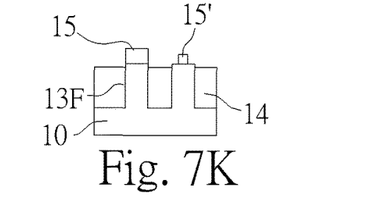
Figure 7L:
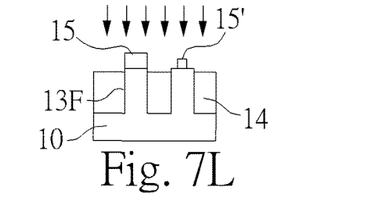
Figure 7M:
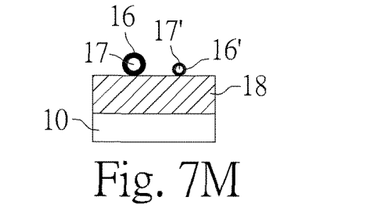

As an additional embodiment for providing multiple diameter nanowires, a description will be discussed with reference to FIGS. 7A-7M. The processes for nanowire formation are similar to that set forth in the discussion of FIGS. 1A-1H. However, after the etch back of the oxide in shallow trench in FIG. 7H, there is an additional masking step. In FIG. 7I, a mask 30 covers the fin 13F and the germanium plug 15 and a part of the oxide in the shallow trench isolation 14 while leaving the fin 13F', plug 15' and part of the shallow trench isolation exposed. The mask 30 prevents any modification of the masked fin 13F and masked plug 15. The mask 30 is typically photoresist or a hard mask, such as a silicon nitride ($Si_3N_4$), and the treatment applied to the exposed fin 13F' and exposed plug 15' could include an oxidation or etching. In FIG. 7J, oxidation converts the exposed fin 13F' and part of the exposed SiGe plug 15' (or other germanium based plug) into $SiO_2$. Since the fin 13F and germanium plug 15 is covered with mask 30, no substantial oxide forms in or on the fin 13F or plug 15. As a result, the silicon portion in fin 13F' or plug 15' is thinned as compared to the covered fin 13F and covered plug 15, as shown in FIG. 7K. The differences in size may then be manifest in the relative thicknesses of reshaped nanowires formed from the plug 15 and the plug 15', respectively. In a next step, the semiconductor fin structure, which was partially oxidized the prior step (FIG. 7J), is subject to oxidation-annealing, similar to that discussed above in connection with FIG. 1I. The effects of annealing of different widths are discussed above. This will cause the annealed plugs to exhibit different characteristics from each other as nanowires 17 and 17' as shown in FIG. 7M. The thinning of the exposed fin 13F' and exposed plug 15' can be accomplished in one iteration or may be repeated one or more times to achieve a selected degree of thinning.

As an alternate to the above, the unmasked portion 13F' and plug 15' may be subject to an additive process to increase the size of the exposed portions. This may include cleaning (stripped of native oxides) and selective epitaxial growth is applied to the exposed portions. To obtain selective silicon growth, chlorine-containing Si precursors such as silicon tetrachloride ($SiCl_4$) and dichlorosilane ($H_2SiCl_2$) may be used. A mixture of silane ($SiH_4$) and HCl may also be used. The growth temperature depends on the precursor used.

The difference in thicknesses of the nanowires may have different drive currents and/or different threshold voltages. In this way, the circuit characteristics of circuits having nanowires resulting from the germanium plugs 15 and 15' can be controlled by the relative sizes of the resulting plugs after this type of differential oxidation treatment.

The suspension of nanowires having different dimensions from each other can also be achieved with reference to the steps shown in FIGS. 2A-2L for suspended nanowires.

The methods described above form Ge-based nanowire structures with increased carrier mobility. The methods described above also can result in nanowire structures with different dimensions, which can be controlled to have certain ratios relative to each other.

While the disclosure has been described with reference to exemplary and non-limiting embodiments, it will be understood by one skilled in the art that various changes may be made, and equivalents may be substituted for elements thereof without departing from the scope of the invention. In addition, many modifications may be made to adapt a particular situation or material to the teachings of the disclosure without departing from the scope of the invention, which is described by the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate;
   a first nanowire disposed over the substrate;
   a second nanowire disposed over the substrate;
   a first pad formed at first ends of the first and second nanowires,
   a second pad formed at second ends of the first and second nanowires,
   wherein the pads comprise different materials than the nanowires, and the first nanowire comprises a source region, a drain region, and a channel region between the source region and the drain region, wherein the channel region of the first nanowire comprises different materials than the source region and the drain region of the first nanowire; and
   a gate surrounding at least a portion of each of the first and second nanowires.

2. The semiconductor device according to claim 1, wherein the first nanowire is formed to a first dimensional cross-section and the second nanowire is formed to a second dimensional cross-section different from the first nanowire, and wherein a ratio of the first dimensional cross-section to the second dimension is controlled to be substantially equal to a predetermined ratio.

3. The semiconductor device according to claim 2, wherein the predetermined ratio is substantially equal to an integer.

4. The semiconductor device according to claim 1, wherein the two pads disposed at respective ends of the first and the second nanowires are common to the nanowires.

5. The semiconductor device according to claim 1, wherein the respective ends of the first and second nanowires are electrically connected to the first pad and the second pad via end faces of the nanowires.

6. The semiconductor device according to claim 1, wherein the first and second nanowires are disposed on top of the first and second pads.

7. The semiconductor device according to claim 1, wherein the pads and nanowires comprise different semiconductors from each other.

8. The semiconductor device according to claim 1, wherein the substrate comprises a fin corresponding to the first nanowire and the second nanowire.

\* \* \* \* \*